US006872956B2

(12) United States Patent
Gnauck et al.

(10) Patent No.: US 6,872,956 B2
(45) Date of Patent: Mar. 29, 2005

(54) PARTICLE BEAM DEVICE WITH A PARTICLE SOURCE TO BE OPERATED IN HIGH VACUUM AND CASCADE-TYPE PUMP ARRANGEMENT FOR SUCH A PARTICLE BEAM DEVICE

(75) Inventors: Peter Gnauck, Reutlingen (DE); Volker Drexel, Königsbronn (DE)

(73) Assignee: Carl Zeiss NTS GmbH, Oberkochen (DE)

(*) Notice: Subject to any disclaimer, the term of this patent is extended or adjusted under 35 U.S.C. 154(b) by 31 days.

(21) Appl. No.: 10/337,795

(22) Filed: Jan. 6, 2003

(65) Prior Publication Data

US 2004/0076529 A1 Apr. 22, 2004

Related U.S. Application Data

(63) Continuation of application No. PCT/EP01/07597, filed on Jul. 3, 2001.

(51) Int. Cl.[7] .................................................. H01J 37/26
(52) U.S. Cl. ............................... 250/441.11; 250/289
(58) Field of Search ........................... 250/441.11, 289; 415/90, 193; 417/44.2; 73/40.7

(56) References Cited

U.S. PATENT DOCUMENTS

| 4,651,171 A | 3/1987 | Tarnowski |
| 4,785,182 A | 11/1988 | Mancuso et al. |
| 4,889,995 A | * 12/1989 | Tsutsumi et al. ...... 250/440.11 |
| 4,992,662 A | 2/1991 | Danilatos |
| 5,733,104 A | 3/1998 | Conrad et al. |
| 5,828,064 A | 10/1998 | Knowles |
| 6,030,189 A | 2/2000 | Bohm et al. |

FOREIGN PATENT DOCUMENTS

| EP | 0 643 227 A1 | 3/1995 |
| WO | PCT/WO00/46508 | 8/2000 |
| WO | PCT/WO02/05309 | 1/2002 |

OTHER PUBLICATIONS

PCT International Search Report for PCT/EP01/07597 dated Nov. 15, 2001.

EPO Application 09256455 (Patent Abstracts of Japan) dated Sep. 22, 1997—Masubiro (Abstract in English).

* cited by examiner

*Primary Examiner*—Kiet T. Nguyen

(57) ABSTRACT

A cascade type pump arrangement for a particle beam device has first and second turbomolecular pumps, wherein an outlet of the second turbomolecular pump is forepumped by an intermediate pressure region situated between a main pump port and an outlet of the first turbomolecular pump. The particle beam device has a particle beam source operated in ultra high vacuum and a specimen chamber operated at pressures from high vacuum at least up to 1 hPa.

8 Claims, 2 Drawing Sheets

PARTICLE BEAM DEVICE WITH A PARTICLE SOURCE TO BE OPERATED IN HIGH VACUUM AND CASCADE-TYPE PUMP ARRANGEMENT FOR SUCH A PARTICLE BEAM DEVICE

CROSS-REFERENCES TO RELATED APPLICATIONS

This is a Continuation application of PCT/EP01/07597 filed Jul. 3, 2001 claiming priority of German Patent Application 100 32 607.2 filed Jul. 7, 2000.

STATEMENT REGARDING FEDERALLY SPONSORED RESEARCH OR DEVELOPMENT

Not applicable.

BACKGROUND OF THE INVENTION

The present invention relates to a particle beam device with a particle source to be operated in high vacuum and a cascade-type pump arrangement for a corresponding particle beam device.

TECHNICAL FIELD

In U.S. Pat. No. 5,828,064 a so-called Environmental Scanning Electron Microscope (ESEM) with a field emission source is described. Such ESEMs permit the electron microscopy of samples under normal atmospheric pressure, or at a pressure only slightly reduced from the normal atmospheric pressure. Since, on the other hand, the so-called Schottky emitters, frequently termed field emission sources, require an ultra high vacuum for their operation, the whole electron microscope is constructed as a differentially pumped system with three intermediate pressure stages. The whole system consequently has five pressure regions, which are separated from one another by four pressure stages or pressure stage diaphragms. Besides the cost of the pumps, the constructional space required for the vacuum connections of the three intermediate pressure regions results in an additional requirement for constructional height, which would not be required for the electron-optical components alone.

From U.S. Pat. No. 4,720,633, a further ESEM is known, in which however the vacuum in the electron source chamber is too poor for operation of the device with a field emission source.

From U.S. Pat. No. 5,717,204, an electron microscope for inspection in semiconductor manufacture is known, in which the ultra high vacuum region and the intermediate pressure region adjacent to the ultra high vacuum are evacuated with ion getter pumps; the specimen chamber and the pressure region adjacent to the sample region are however pumped by a separate turbomolecular pump, the two turbomolecular pumps being connected to the intake side of a common forepump. Such inspection devices are usually not designed for operation with a poor vacuum in the specimen chamber.

From DE 43 31 589-A1, a cascade-type pump arrangement with turbomolecular pumps connected in series is known, in which the respective outlet of one turbomolecular pump is forepumped by the main port of a turbomolecular pump connected before it, the intake side of the front turbomolecular pump being simultaneously connected by a T-piece to an intermediate pressure region. By means of this cascade-type pump arrangement, the vacuum in the intermediate pressure region, pumped by the turbomolecular pump arranged before it, is loaded by the gas stream of the next higher vacuum stage.

From U.S. Pat. No. 4,889,995, a scanning electron microscope is known in which a turbomolecular pump forepumped by a rotary pump serves, in parallel via valves, for evacuating both the specimen chamber and also the chamber of the electron source and the intermediate pressure region. In addition, ultra high vacuum pumps are provided for evacuating the electron source chamber and the two adjacent intermediate pressure regions. Operation with a poor vacuum in the specimen chamber is likewise not possible with such a pump arrangement.

From an article in Japan J. Appl. Phys., Suppl. 2, p. 249 ff. (1974), an electron microscope is known with a pump arrangement of oil diffusion pumps. Oil diffusion pumps, because of their low pumping capacity at high pressures, are however unsuitable for electron microscopes in which the specimen chamber is to be operable with varying pressures.

SUMMARY OF THE INVENTION

The present invention has as its object to provide a particle beam device, particularly a scanning electron microscope, which has a simplified structure in spite of a specimen chamber pressure that is variable nearly up to environmental pressure, and of ultra high vacuum in the region of the particle source. A further object of the present invention is to provide a vacuum pump system with which a correspondingly simplified construction of a particle beam device is made possible.

These objects are attained by a pump arrangement with a cascade-type pump arrangement for a particle beam device with first and second turbomolecular pumps, wherein the outlet of the second turbomolecular pump is forepumped by an intermediate pressure region situated between the main pump port and the outlet of the first turbomolecular pump, and a particle beam device, which has a particle beam source to be operated in ultra high vacuum, and a specimen chamber that can be operated at pressures from high vacuum at least up to 1 hPa, and wherein a cascade-type pump arrangement according to the invention is provided.

A cascade-type pump arrangement for a particle beam device according to the invention has two turbomolecular pumps, the second turbomolecular pump of which serves for forepumping the output of the first turbomolecular pump, the outlet of the second turbomolecular pump being connected to an intermediate pressure region of the first turbomolecular pump, situated between the main pump port and the outlet.

The first turbomolecular pump can be a so-called split-flow pump, which has an additional pump port situated in the region of the drag stage of the turbomolecular pump. This drag stage pump port is then preferably used for forepumping the second turbomolecular pump.

Termed a drag stage in the usual manner is an arrangement, frequently used in turbomolecular pumps, of a disk rotating around a stator, having an elevation and a hole in the edge region, arranged on the outlet side of the last rotor blade of the turbomolecular pump, and serving for additional compression of the pumped gas.

The forepumping of a turbomolecular pump by the forevacuum of an intermediate pressure region, e.g. of the drag stage pump port, of a forepumped turbomolecular pump has the advantage that the region of the main pump port is not loaded by the gas flow of the forepumped turbomolecular pump. A better vacuum can thereby be attained in the region evacuated by the main pump port, in spite of the double function of the forepumped turbomolecular pump.

The particle beam device with a corresponding cascade-type pump arrangement has a particle source to be operated in high vacuum and a specimen chamber which can be operated at pressures from the high vacuum region, with pressures under $10^{-3}$ hPa, to at least 1 hPa (hectopascal). Exactly two further pressure regions are provided between the ultra high vacuum region of the particle source and the specimen chamber, in the particle beam device according to the invention.

The particle beam device accordingly has exactly four pressure regions, namely the ultra high vacuum region in which the particle source is arranged, two intermediate pressure regions, and the specimen chamber. There are thus three pressure stages in all, for which three particle stage diaphragms are required in all, in the particle beam device according to the invention.

In order to manage with only three pressure stages, the pressure region adjacent to the ultra high vacuum region is pumped by a turbomolecular pump. Furthermore, the outlet of this turbomolecular pump is forepumped by a preceding turbomolecular pump, the outlet of the turbomolecular pump being connected to the drag stage of the preceding turbomolecular pump. By this pump arrangement, the pressure in the pressure region adjacent to the ultra high vacuum region is kept to values greater than $10^{-6}$ hPa.

In a further advantageous embodiment, the main pump port of the first turbomolecular pump is connected to the pressure region adjacent to the specimen chamber. The first turbomolecular pump can thereby fulfill a double function, namely simultaneously to forepump the outlet of the second turbomolecular pump and also to evacuate the pressure region adjacent to the specimen chamber.

Furthermore, a forepump is preferably provided which forepumps the outlet of the first turbomolecular pump. This forepump can additionally serve to evacuate the specimen chamber to the desired pressure. Insofar as the particle beam device is also to be operable at pressures above 5 hPa in the specimen chamber, it is however recommended to provide a second forepump for evacuating the specimen chamber, so that the first forepump exclusively forepumps the outlet of the first turbomolecular pump.

BRIEF DESCRIPTION OF THE DRAWINGS

Details of the invention are described in detail hereinafter using the embodiments described in the accompanying drawings.

DETAILED DESCRIPTION OF THE INVENTION

Figure 1:
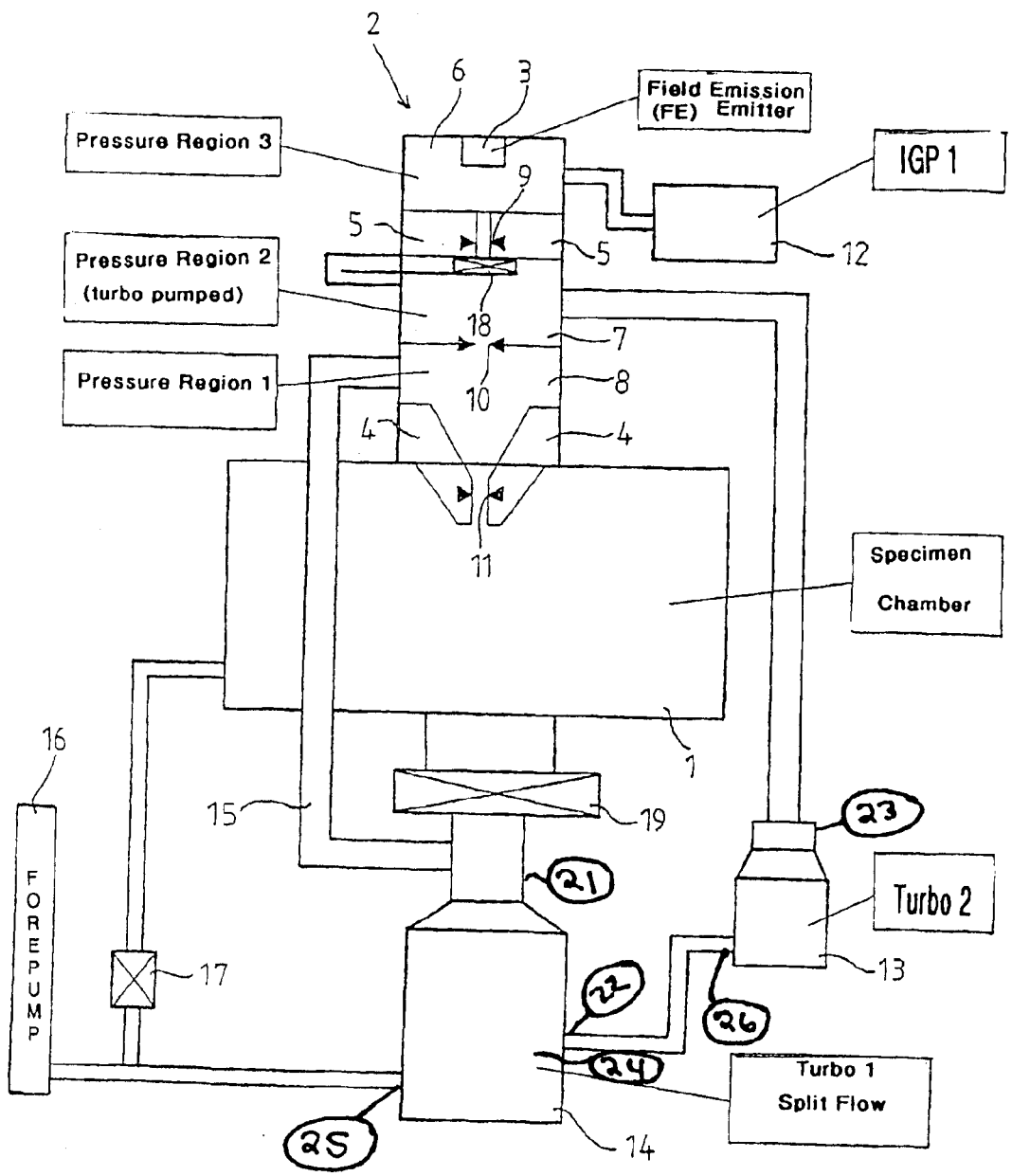
FIG. 1 shows a principle sketch of a first embodiment of the invention for lower chamber pressures.

In FIG. 1, (1) denotes the specimen chamber and (2) the electron-optical column of the particle beam device. The electron-optical column (2) has three pressure regions (6), (7), (8), which are respectively separated from one another by pressure stage diaphragms (9), (10), (11). The uppermost (seen geometrically) pressure region (6) of the electron-optical column (2) is designed for maintaining an ultra high vacuum with a pressure of less than $5 \times 10^{-8}$ hPa. This ultra high vacuum region is evacuated by an ion getter pump (12). The particle source (3), in the form of a field emission source or a Schottky emitter, is arranged in this ultra high vacuum region.

The condenser (5) of the particle beam device is arranged between the ultra high vacuum region (6) and the adjacent intermediate pressure region (7), only its pole shoes being indicated in FIG. 1. The pressure stage diaphragm (9) is arranged at about the height of, or (seen in the electron propagation direction), behind the pole shoe gap for the condenser lens (5), and ensures the maintenance of a suitable pressure difference between the ultra high vacuum region (6) and the intermediate pressure region (7) adjacent thereto.

The first intermediate pressure region (7) is followed by a second intermediate pressure region (8), which is separated from the first intermediate pressure region by a second pressure stage diaphragm (10). The objective lens (4), likewise only the pole shoes of which are indicated in FIG. 1, of the particle beam device is arranged between this second intermediate pressure region (8) and the specimen chamber. The third pressure diaphragm (11) is arranged between, or (seen in the electron propagation direction) in front of, the pole shoes of the objective lens (4), and ensures a suitable pressure difference between the second intermediate pressure region (8) and the specimen chamber (1).

For setting suitable vacuum conditions, there is provided in the embodiment of FIG. 1, besides the ion getter pump (12) for the ultra high vacuum region (6), a cascade-type pump arrangement of a forepump (16) and two turbomolecular pump (13), (14), partially likewise connected in series. The forepump (16) serves on the one hand to evacuate the specimen chamber directly, via a separate pipe connection, and at the same time to pump out the outlet (25) of the first turbomolecular pump (14). The evacuation of the specimen chamber (1) can be regulated by means of a valve (17) in the pipe connection. The pressure in the specimen chamber can be set by means of an adjustable gas inlet valve (not shown).

The first turbomolecular pump (14) is of the high-capacity, so-called split flow pump design, and fulfills a threefold function. The intake connection of the main pump port (21) is flanged via a pipe duct (15) directly onto the intermediate pressure region (8) adjacent to the specimen chamber (1) and thereby effects a direct evacuation of this intermediate pressure region. At the same time, the intake connection of the main pump port (21) is flanged via a second valve (19) directly to the specimen chamber (1). The intake connection of the drag stage port (22) of the first turbomolecular pump (14) is furthermore connected to the outlet of the second turbomolecular pump (13), so that the first turbomolecular pump (14) serves for forepumping the second turbomolecular pump (13) via the drag stage port (22), in addition to evacuating the intermediate pressure region (8) adjacent to the specimen chamber (1). The intake connection (23) of the second turbomolecular pump (13) is directly connected to the intermediate pressure region (7) adjacent to the ultra high vacuum region (6).

Insofar as a direct connection of a vacuum pump to a pressure region is mentioned hereinbefore or hereinafter, it is mean that the resulting evacuation of the concerned pressure region performed by this pump takes place directly, that is, without the gas molecules pumped out by this pump having to pass through a pressure stage diaphragm between the concerned pressure region and the intake connection of the pump.

The vacuum system described hereinabove is a differentially pumped vacuum system with four pressure regions in all.

With the described cascade-type serially connected pump arrangement, using a single ion getter pump (12), the two turbomolecular pumps (13), (14) and a single forepump (16), an ultra high vacuum with pressures of less than $5 \times 10^{-8}$ hPa in the ultra high vacuum chamber (6) can be maintained with pressures between 5 hPa and $10^{-7}$ hPa in the specimen chamber (1). With desired pressures in the specimen chamber (I) between $10^{-2}$ hPa and 5 hPa, the valve (17) between the forepump (16) and the specimen chamber (1) is opened and the second valve (19) between the first turbomolecular pump (14) and the specimen chamber (1) is closed. The vacuum in the specimen chamber (1) is then determined exclusively by the vacuum which can be attained with the forepump (16) or adjusted on this. The maintenance of a vacuum between $10^{-4}$ and $10^{-6}$ hPa in the intermediate pressure region (7) adjacent to the ultra high vacuum region is ensured by the forepumping of the outlet (26) of the second turbomolecular pump by the forevacuum of the drag stage (24) of the first turbomolecular pump (14) and thereby the nearly complete pump power of the first turbomolecular pump (14) serving exclusively for pumping the intermediate pressure region (8) adjacent to the specimen chamber.

At pressures below $10^{-2}$ hPa in the specimen chamber (1) which cannot be attained with the forepump (16), the first valve (17) between the forepump (16) and the specimen chamber (1) is closed, and the second valve (19) between the specimen chamber (1) and the first turbomolecular pump (14) is opened. The forepump (16) then exclusively serves for forepumping the first turbomolecular pump (14). Both the specimen chamber (1) and the intermediate pressure region (8) adjacent to the specimen chamber (1) are then directly pumped by the first turbomolecular pump (14). The pressure stage diaphragm (11) arranged in the objective lens (4) is without effect in this case. By means of the second turbomolecular pump (13), forepumped by the first turbomolecular pump (14), a vacuum between $10^{-4}$ and $10^{-6}$ hPa is maintained in this case also in the intermediate pressure region (7) adjacent to the ultra high vacuum region (6).

In both cases, the fore-vacuum of the drag stage (24) of the first turbomolecular pump, by which the second turbomolecular pump (13) is forepumped, is in a region between $10^{-1}$ hPa and $10^{-4}$ hPa.

So that the ultra high vacuum in the ultra high vacuum region (6) is maintained even when the specimen chamber (1) is opened, a shutoff valve (18) is provided within the electron-optical column, preferably between the ultra high vacuum region and the pressure region (7) adjacent to the ultra high vacuum region, and is closed before opening the specimen chamber (1). The forepump (16) and the two turbomolecular pumps (13), (14) can thereby be set out of operation when opening the specimen chamber (1).

Figure 2:
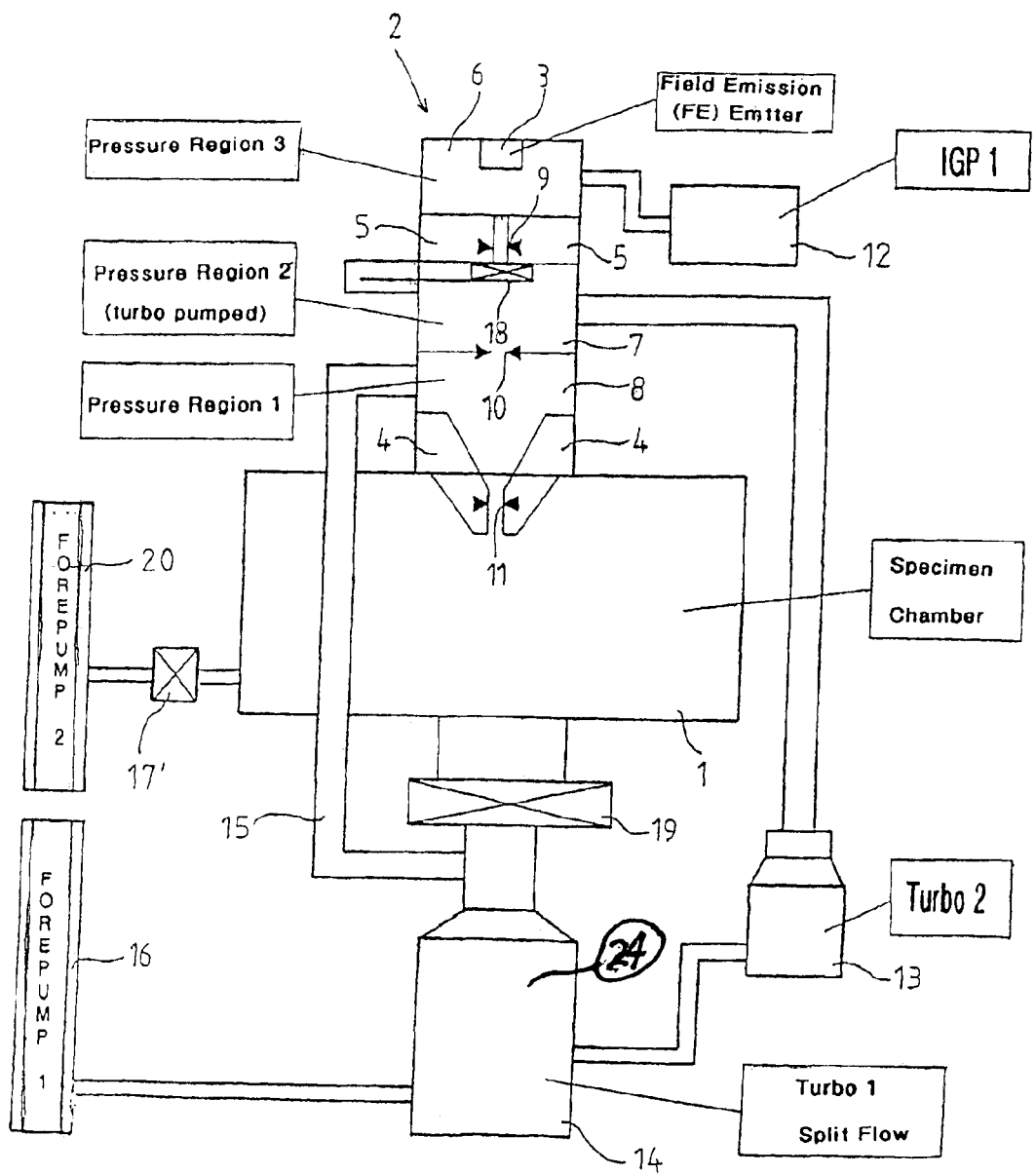
FIG. 2 shows a principle sketch of a second embodiment of the invention for higher chamber pressures.

The embodiment shown in FIG. 2 substantially corresponds to the embodiment in FIG. 1. Consequently those components in FIG. 2 which correspond to those in FIG. 1 are given identical reference numerals. Reference is made to the previous description of FIG. 1 as regards FIG. 2 insofar as the embodiments correspond.

The essential difference between the embodiment according to FIG. 2 and that according to FIG. 1 is that the forepump (16) in the embodiment according to FIG. 2 serves exclusively for forepumping the first turbomolecular pump (14), the drag stage (24) of which on the fore-vacuum side again serves to forepump the second turbomolecular pump (13). A second forepump (20) is provided for evacuating the specimen chamber (1), and the pumping capacity thereof is again controllable by means of a first valve (17). With this alternative pump arrangement with a second forepump (20). The particle beam device can also be used at pressures in the specimen chamber of up to 100 hPa, while maintaining the ultra high vacuum in the ultra high vacuum region (6). With chamber pressures below $10^{-2}$ hPa in the specimen chamber (1), both the specimen chamber (1) and also the intermediate pressure region (8) adjacent to the specimen chamber (1) are exclusively pumped by means of the first turbomolecular pump. In this case, the first valve (17') between the second forepump (20) and the specimen chamber (1) is closed, and the second valve (19) between the first turbomolecular pump (14) and the specimen chamber (1) is opened. At pressures between $10^{-2}$ and 100 hPa, on the other hand, the first valve (17') is opened, so that the specimen chamber (1) is evacuated by the second forepump (20), and the second valve (19) is closed. The stronger gas stream between the specimen chamber and the intermediate pressure region (8) adjacent to the specimen chamber (1), due to the higher chamber pressures, is intercepted in this embodiment in that the first forepump (16) serves exclusively for forepumping the first turbomolecular pump (14), which by this means maintains a correspondingly high pumping capacity. Also in this case the second turbomolecular pump (13), forepumped by the drag stage (24) of the first turbomolecular pump (14) with a forevacuum in the range between $10^{-1}$ hPa and $10^{-4}$ hPa, ensures the maintenance of a vacuum between $10^{-5}$ and $10^{-6}$ hPa in the intermediate pressure region (7) adjacent to the ultra high vacuum region (6).

In the embodiment shown in FIG. 2, a pressure difference of up to 10 orders of magnitude, i.e., of $10^{10}$ hPa, is maintained between the ultra high vacuum region (6) and the specimen chamber.

It would also be basically conceivable, as in the cited prior art, to also evacuate the intermediate pressure region (7) adjacent to the ultra high vacuum region (6) by means of a second ion getter pump. In this case, the intermediate pressure region adjacent to the specimen chamber (1) would then have to be evacuated by means of a turbomolecular pump forepumped by the drag stage of a turbomolecular pump. The second ion getter pump would then, however, have to be designed with a very high pumping capacity, so that, again due to the larger dimensions of the ion getter pump, a greater constructional height of the electron-optical column would result.

We claim:

1. Cascade-type pump arrangement for a particle beam device comprising:
    a first turbomolecular pump, and
    a second turbomolecular pump,
    said first turbomolecular pump having an outlet, a main pump port and an additional pump port defining an intermediate pressure region,
    said second turbomolecular pump having an inlet and an outlet,
    wherein said outlet of said second turbomolecular pump is connected to said additional pump port of said first turbomolecular pump.

2. Cascade-type pump arrangement of claim 1, wherein said first turbomolecular pump comprises a split flow pump and has a drag stage, and
    wherein said additional pump port is connected to said drag stage.

3. Cascade-type pump arrangement of claim 1, wherein a further forepump is provided and connected to said outlet of said first turbomolecular pump.

4. Particle beam device comprising:
    a particle beam source to be operated in ultra high vacuum, a specimen chamber which can be operated at a varying pressure in a range between high vacuum and a high pressure value, said high pressure value being at least 1 hPa, and a cascade-type pump arrangement of claim 1.

5. Particle beam device of claim 4, wherein said particle beam source is arranged in a ultra high vacuum region, and wherein exactly two further intermediate pressure regions are provided between said ultra high vacuum region and said specimen chamber.

6. Particle beam device of claim 5, wherein said inlet of said second turbomolecular pump is connected to one of said two further intermediate pressure regions adjacent to said ultra high vacuum region.

7. Particle beam device of claim 5, wherein said main pump port of said first turbomolecular pump is connected to one of said two further intermediate pressure regions adjacent to said specimen chamber.

8. Particle beam device of claim 7, further comprising a forepump, wherein said forepump is connected directly to the specimen chamber via a valve.

* * * * *